(12) United States Patent
Bae et al.

(10) Patent No.: US 11,747,947 B2
(45) Date of Patent: Sep. 5, 2023

(54) TOUCH PANEL AND METHOD OF MANUFACTURING THE SAME

(71) Applicant: SAMSUNG DISPLAY CO., LTD., Yongin-si (KR)

(72) Inventors: Joo-Han Bae, Seongnam-si (KR); Sung Ku Kang, Suwon-si (KR); Jin Hwan Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 362 days.

(21) Appl. No.: 16/834,992

(22) Filed: Mar. 30, 2020

(65) Prior Publication Data
US 2020/0233510 A1 Jul. 23, 2020

Related U.S. Application Data

(62) Division of application No. 14/863,218, filed on Sep. 23, 2015, now abandoned.

(30) Foreign Application Priority Data

Feb. 25, 2015 (KR) .......................... 10-2015-0026800

(51) Int. Cl.
*G06F 3/044* (2006.01)
*G06F 3/041* (2006.01)
(Continued)

(52) U.S. Cl.
CPC ............ *G06F 3/0446* (2019.05); *G03F 7/092* (2013.01); *G06F 3/0443* (2019.05);
(Continued)

(58) Field of Classification Search
CPC .... G06F 3/0446; G06F 3/0443; G06F 3/0445; G06F 2203/04102; G06F 2203/04103;
(Continued)

(56) References Cited

U.S. PATENT DOCUMENTS 8,722,313 B2 5/2014 Shin
9,423,903 B2 8/2016 Shin
(Continued)

FOREIGN PATENT DOCUMENTS

JP 2014-010516 A 1/2014
KR 10-2006-0067029 A 6/2006
(Continued)

*Primary Examiner* — Md Saiful A Siddiqui
(74) *Attorney, Agent, or Firm* — Lewis Roca Rothgerber Christie LLP

(57) ABSTRACT

A touch panel and method of manufacturing the same are disclosed. In one aspect, the touch panel includes a substrate, a first touch electrode line formed over the substrate and including a plurality of first touch electrodes which are electrically connected to each other, and a second touch electrode line formed to cross the first touch electrode line and being electrically insulated therefrom. The second touch electrode line can include a plurality of second touch electrodes which are electrically connected to each other. The touch panel can also include a plurality of connecting wires respectively connected to the first and second touch electrode lines. At least one of the first touch electrode line, the second touch electrode line, and the connecting wires can include at least one photosensitive conductive layer having a metal nanowire.

6 Claims, 21 Drawing Sheets

(51) Int. Cl.
  *G03F 7/09* (2006.01)
  *H10K 59/40* (2023.01)
(52) U.S. Cl.
  CPC ........... *G06F 3/0445* (2019.05); *H10K 59/40* (2023.02); *G06F 2203/04102* (2013.01); *G06F 2203/04103* (2013.01); *G06F 2203/04111* (2013.01); *G06F 2203/04112* (2013.01); *Y10T 29/49117* (2015.01)
(58) Field of Classification Search
  CPC .. G06F 2203/04111; G06F 2203/04112; G06F 3/041; G03F 7/092; H01L 27/323; Y10T 29/49117
  See application file for complete search history.

(56) References Cited

U.S. PATENT DOCUMENTS

| | | | |
|---|---|---|---|
| 9,569,020 B2 | 2/2017 | Park et al. | |
| 9,851,859 B2 | 12/2017 | Park et al. | |
| 2012/0080605 A1* | 4/2012 | Kawanabe | G01T 1/243 250/370.08 |
| 2013/0027118 A1 | 1/2013 | Ho et al. | |
| 2013/0181727 A1* | 7/2013 | Nishizawa | G01R 3/00 156/247 |
| 2014/0028584 A1* | 1/2014 | Park | G06F 3/0443 345/173 |
| 2014/0063373 A1* | 3/2014 | Wu | G02F 1/13338 349/12 |
| 2015/0022492 A1 | 1/2015 | Park et al. | |
| 2016/0041644 A1* | 2/2016 | Bae | G06F 3/0443 216/13 |

FOREIGN PATENT DOCUMENTS

| | | | |
|---|---|---|---|
| KR | 10-2011-0121892 A | | 11/2011 |
| KR | 10-2012-0017165 A | | 2/2012 |
| KR | 10-1397682 | * | 1/2014 |
| KR | 2014003728 | * | 1/2014 |
| KR | 20140003728 A | * | 1/2014 |
| KR | 10-2014 0016070 A | | 2/2014 |
| KR | 10-1401662 B1 | | 5/2014 |
| KR | 10-2015-0009315 A | | 1/2015 |

* cited by examiner

TOUCH PANEL AND METHOD OF MANUFACTURING THE SAME

CROSS-REFERENCE TO RELATED APPLICATIONS

This application is a divisional of U.S. patent application Ser. No. 14/863,218, filed Sep. 23, 2015, which claims priority to and the benefit of Korean Patent Application No. 10-2015-0026800, filed Feb. 25, 2015, the entire content of both of which is incorporated herein by reference.

BACKGROUND

Field

The described technology generally relates to a touch panel and a method of manufacturing the same.

Description of the Related Technology

Display devices such as liquid crystal displays (LCDs) and organic light-emitting diode (OLED) displays, portable transmission devices, other information processing devices, and the like, perform functions by using various input devices. Recently, touch sensing input devices have become popular.

Touch sensors are used to determine contact information such as whether an object approaches or contacts a screen, a contact position thereof, and the like, by sensing change(s) in pressure, charge, light, or the like. These change(s) are applied to the screen of the display device when a user writes text or draws a figure by approaching or contacting the screen with their finger or a touch pen. The display device can receive an image signal based on the contact information to display images.

Touch sensors can be classified based on their measured physical characteristics into resistive, capacitive, electromagnetic resonance (EMR), and optical type touch sensors.

Resistive type touch sensors include two electrodes which are separately formed to face each other and contact each other when applied with pressure by an external object. When the two electrodes contact each other, a voltage variation is generated according to a change in resistance at the contact position which is recognized to determine the contact position and the like.

Capacitive type touch sensors includes a sensing capacitor including a sensing electrode for transferring a sensing signal. The sensing capacitor determines whether it has been contacted, the contact position, and the like, by sensing a change in capacitance generated when a conductor, such as a finger, approaches the sensor. Capacitive type touch sensors can sense touch input when a user contacts a touch panel and requires contact by a conductive object.

The above information disclosed in this Background section is only to enhance the understanding of the background of the disclosure, and therefore it may contain information that does not form the prior art that is already known in this country to a person of ordinary skill in the art.

SUMMARY OF CERTAIN INVENTIVE ASPECTS

One inventive aspect is a touch panel including a metal nanowire and a manufacturing method thereof.

Another aspect is a touch panel and a manufacturing method thereof including silver nanowire and having a simplified manufacturing process that can selectively form patterns.

Another aspect is a touch panel, comprising a substrate; a first touch electrode line formed over the substrate and including a plurality of first touch electrodes which are electrically connected to each other; a second touch electrode line formed to cross the first touch electrode line and being electrically insulated therefrom, wherein the second touch electrode line includes a plurality of second touch electrodes which are electrically connected to each other; and a plurality of connecting wires respectively connected to the first and second touch electrode lines, wherein at least one of the first touch electrode line, the second touch electrode line, and the connecting wires includes at least one photosensitive conductive layer including a metal nanowire.

In exemplary embodiments, the at least one photosensitive conductive layer includes a first photosensitive conductive layer and a second photosensitive conductive layer having different transmittances, wherein the connecting wire includes the first and second photosensitive conductive layers, and wherein the second photosensitive conductive layer is formed on the first photosensitive conductive layer.

In exemplary embodiments, the first touch electrodes are spaced apart at a predetermined interval, wherein the first touch electrode line further includes a plurality of first connectors electrically connecting the first touch electrodes, wherein the second touch electrodes are spaced apart at a predetermined interval, and wherein the second touch electrode line further includes a plurality of second conductors electrically connecting the second touch electrodes.

In exemplary embodiments, the first touch electrodes and the second touch electrodes are formed of the first photosensitive conductive layer. The transmittance of the first photosensitive conductive layer can be greater than that of the second photosensitive conductive layer. The resistance of the first photosensitive conductive layer can be greater than that of the second photosensitive conductive layer. The photosensitivity of the first photosensitive conductive layer and the photosensitivity of the second photosensitive conductive layer can have opposite signs.

In exemplary embodiments, the touch panel further comprises a plurality of pads respectively electrically connected to the connecting wires, wherein the pads are formed of a same material as the first and second touch electrodes. The second touch electrodes and the second connectors can be integrally formed. The touch panel can further comprise an insulating layer that is interposed between the first and second connectors. The connecting wires can include the photosensitive conductive layer and the first touch electrode line and the second touch electrode line can include a conductive layer. The touch panel can further comprise a plurality of pads respectively electrically connected to the connecting wires, wherein the pads are formed of the same material as that of the first and second touch electrodes.

In exemplary embodiments, the conductive layer further includes an overcoat. The transmittance of the conductive layer can be greater than that of the photosensitive conductive layer. The resistance of the conductive layer can be greater than that of the photosensitive conductive layer. The at least one photosensitive conductive layer can includes photosensitive resin layer and a conductive layer formed of a metal nanowire which is buried at an upper portion of the photosensitive resin layer.

The metal nanowire can be formed of silver or copper.

Another aspect is a method of manufacturing a touch panel, comprising forming a first photosensitive conductive layer over a substrate; forming a second photosensitive conductive layer over the first photosensitive conductive layer, wherein the photosensitivities of the first and second photosensitive conductive layers have opposite signs; forming a preliminary conductive pattern by patterning the second photosensitive conductive layer and the first photosensitive conductive layer; and forming i) a touch electrode in a touch area of the substrate and ii) a connecting wire outside of the touch area and electrically connected to the touch electrode by removing at least a portion of the second photosensitive conductive layer formed in the touch area through exposure and development of the preliminary conductive pattern.

In exemplary embodiments, each of the first and second photosensitive conductive layers is formed to include a photosensitive resin layer and a metal nanowire buried in the photosensitive resin layer. The forming of the second photosensitive conductive layer can be performed such that a first conductive layer of the second photosensitive conductive layer contacts a second conductive layer of the first photosensitive conductive layer. The first conductive layer of the first photosensitive conductive layer can have a greater density of metal nanowires than the second conductive layer of the second photosensitive conductive layer.

In exemplary embodiments, the forming of the first photosensitive conductive layer is performed by removing a release paper from the first photosensitive conductive layer and then transferring the first photosensitive conductive layer onto the substrate, and wherein the forming of the second photosensitive conductive layer is performed by removing a release paper from the second photosensitive conductive layer and then transferring the second photosensitive conductive layer onto the first photosensitive conductive layer.

Another aspect is a method of manufacturing a touch panel, the method comprising forming a conductive film including a metal nanowire over a substrate; forming a photosensitive conductive layer over the conductive film; forming an upper preliminary conductive pattern by performing a first exposure and development; forming a lower preliminary conductive pattern by etching the conductive layer by using the upper preliminary conductive pattern as a mask; and forming i) a touch electrode in a touch area of the substrate and ii) a connecting wire outside of the touch area and electrically connected to the touch electrode by removing the upper preliminary conductive pattern formed in the touch area through a second exposure and development.

In exemplary embodiments, the photosensitive conductive layer includes a photosensitive resin layer and a metal nanowire layer which is buried at an upper portion of the photosensitive resin layer. The forming of the photosensitive conductive layer can comprise removing a release paper attached on the photosensitive conductive layer and then transferring the photosensitive conductive layer such that the metal nanowire layer contacts the conductive film.

According to at least one exemplary embodiment of the present disclosure, it is possible to easily manufacture a touch panel despite the panel including a metal nanowire, e.g., silver nanowire, which has a low etching selectivity with respect to a metal film.

DETAILED DESCRIPTION OF CERTAIN INVENTIVE EMBODIMENTS

Figure 1:
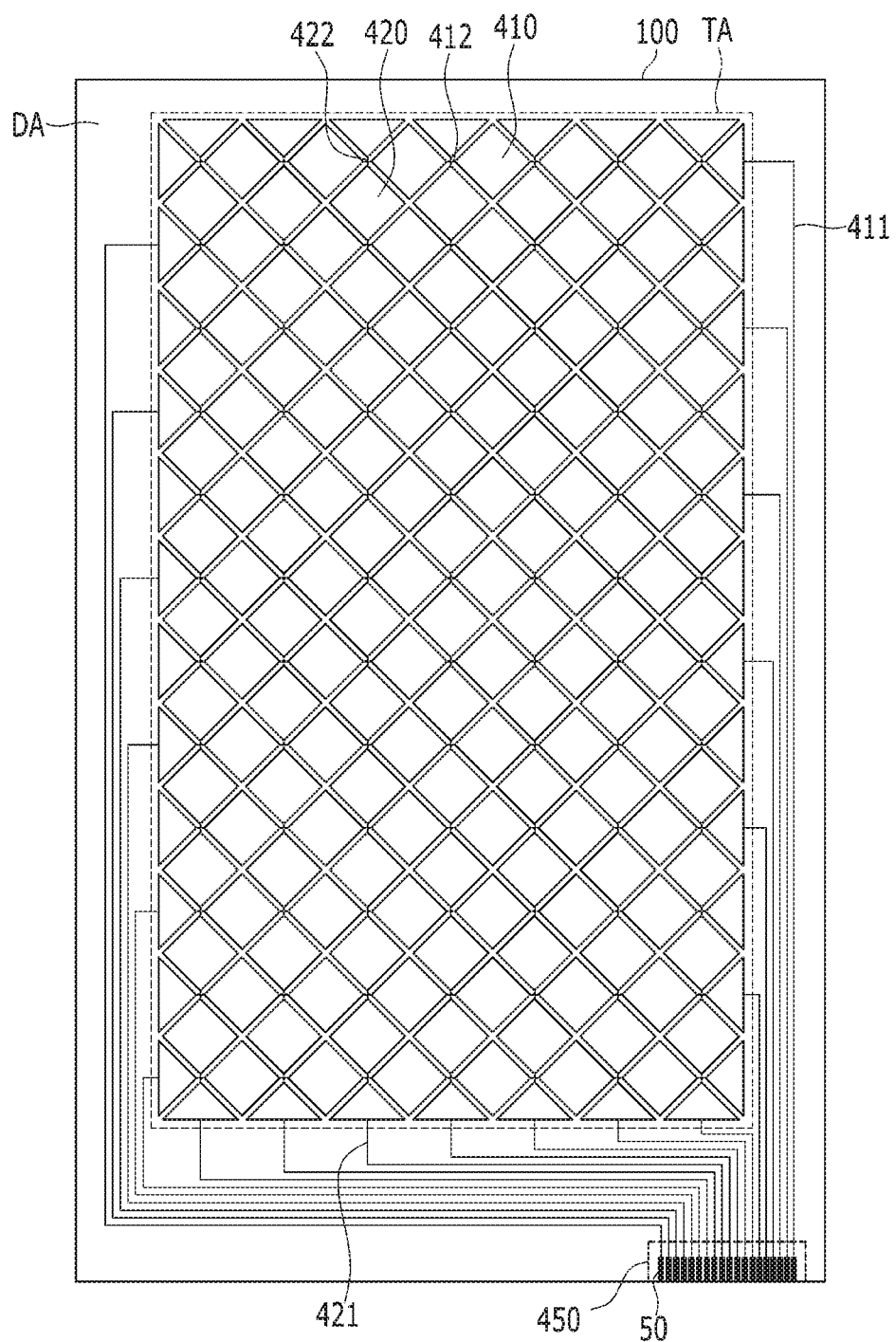
FIG. 1 is a layout view of a touch panel according to an exemplary embodiment.

Touch panels can be included in flexible electronic devices, which have been recently undergoing research and development. However, in order to provide sufficient flexibility for flexible electronic devices, an electrode of the touch panel should also be sufficiently flexible.

In order to increase flexibility, touch panels can include a material that increases the flexibility of the touch electrodes, for example, silver nanowire (AgNW).

However, when a touch sensor includes a silver nanowire and a metal layer, the etching selectivity between the silver nanowire and a metal material of the metal layer is reduced, thereby complicating the process for selectively forming the silver nanowire and the metal layer.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thicknesses of layers, films, panels, regions, etc., may be exaggerated for the sake of clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

To clearly describe the present disclosure, portions that are irrelevant to the description are omitted and like numerals refer to like or similar constituent elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a touch panel according to an exemplary embodiment of the present disclosure will be described with reference to the accompanying drawings.

Figure 2:
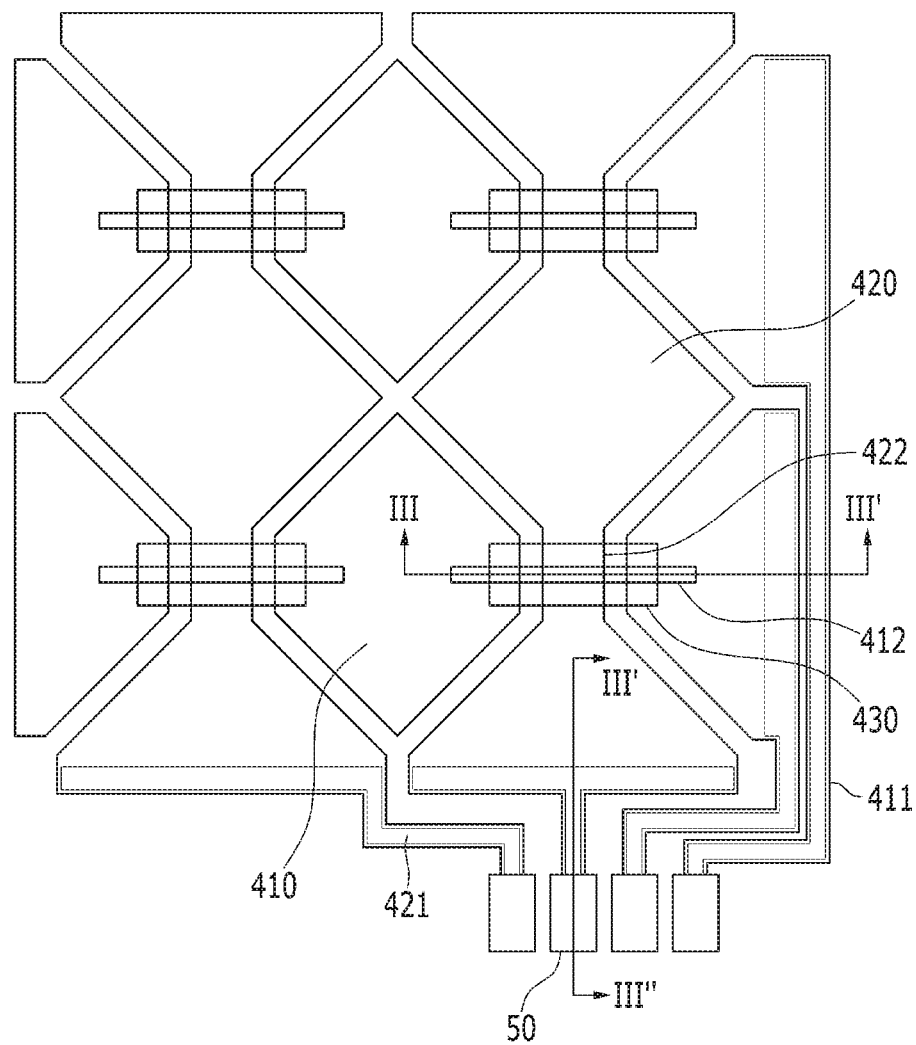
FIG. 2 is an enlarged view of a portion of FIG. 1.
Figure 3:
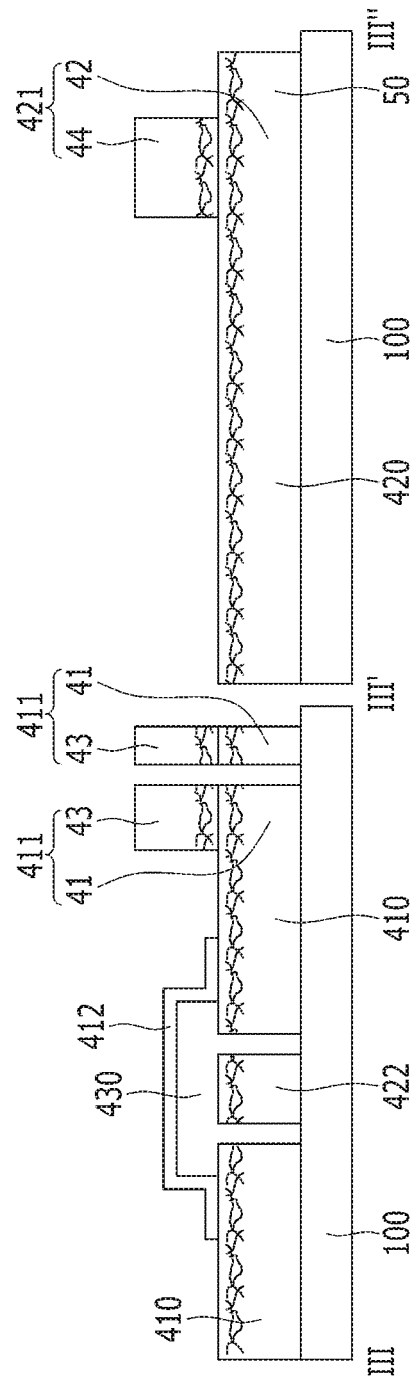
FIG. 3 consists of cross-sectional views take along line III-III' and line III'-III" of FIG. 2.

FIG. 1 is a layout view of a touch panel according to an exemplary embodiment. FIG. 2 is an enlarged view of a portion of FIG. 1. FIG. 3 consists of cross-sectional views take along line III-III' and line III'-III" of FIG. 2.

Referring to FIG. 1, the touch panel includes a plurality of first touch electrodes 410 and a plurality of second touch electrodes 420 formed on a touch substrate 100.

The touch substrate 100 can be formed of a plastic such as polycarbonate, polyimide, and/or polyether sulfone, glass, or the like. The touch substrate 100 can be a transparent flexible substrate that is flexible, e.g., the substrate can be foldable (bendable), rollable, and/or stretchable or elastically deformable in at least one direction.

The first and second touch electrodes 410 and 420 can be formed to be alternately arranged in a touch area TA. The first touch electrodes 410 can be arranged in a column direction and/or a row direction, and the second touch electrodes 420 can be arranged in a column direction and/or a row direction.

The first and second touch electrodes 410 and 420 can be formed on the same layer, but the present disclosure is not limited thereto. Alternatively, the first and second touch electrodes 410 and 420 can be formed on different layers. When the first and second touch electrodes 410 and 420 are formed on different layers, the first and second touch electrodes 410 and 420 can be formed on different surfaces of the touch substrate 100 and/or can be formed in different layers above the same surface of the touch substrate 100.

Each of the first and second touch electrodes 410 and 420 can have a quadrangular shape. Depending on the embodiment, the first and second touch electrodes 410 and 420 can have various shapes, such as a shape including protrusions for improving the sensitivity of a touch sensor, without being limited thereto.

The first touch electrodes 410 arranged in the same row or column can be connected to each other or separated from each other inside or outside the touch area TA. Similarly, the second touch electrodes 420 arranged in the same column or row can be connected to each other or separated from each other inside or outside the touch area TA.

For example, as shown in FIG. 1, when the first touch electrodes 410 arrange in the same row are connected to each other inside the touch area TA, the second touch electrodes 420 arranged in the same column can be connected to each other inside the touch area TA. For example, the first touch electrodes 410 arranged in each row can be connected to each other through a first connector 412, and the second touch electrodes 420 arranged in each column can be connected to each other through a second connector 422.

Referring to FIG. 2 and FIG. 3, the second connector 422 connecting adjacent second touch electrodes 420 can be formed on the same layer as the second touch electrodes 420 and can be formed of the same material as that of the second touch electrode 420. Briefly, the second touch electrodes 420 and the second connectors 422 can be integrated with each other and can be simultaneously patterned. In some embodiments, the second touch electrodes 420 are spaced apart at a predetermined interval.

The first connector 412 connecting adjacent first touch electrodes 410 can be formed on a layer that is different from the first touch electrodes 410. That is, the first touch electrodes 410 and the first connectors 412 can be separated from each other and can be separately patterned. In some embodiments, the first touch electrodes are spaced apart at a predetermined interval. The first touch electrodes 410 and the first connectors 412 can be connected to each other through direct contact.

An insulating layer 430 is interposed between the first connectors 412 and the second connectors 422 to electrically insulate the first connectors 412 from the second connectors 422. The insulating layers 430 can include a plurality of independent island-shaped insulators formed at every intersection between the first and second connectors 412 and 422, but the present disclosure is not limited thereto. The insulating layer 430 can be arranged to partially expose at least a portion of the first touch electrodes 410 such that the first connectors 412 can be electrically connected to the first touch electrodes 410.

According to another exemplary embodiment of the present disclosure, the insulating layers 430 are formed on an entire surface of the touch substrate 100, and although not illustrated, the insulating layers 430 can be partially removed to expose portions of the first touch electrodes 410 that are adjacent to each other in the column direction for the connection between the first touch electrodes.

In contrast to the illustration of FIGS. 2 and 3, the first connectors 412 that connect adjacent first touch electrodes 410 can be formed on the same layer as the first touch electrodes 410 and can be integrated with the first touch electrodes 410. The second connectors 422 that connect adjacent second touch electrodes 420 can be formed on a layer that is different from the second touch electrodes 420.

As such, the first touch electrodes 410 and the first connectors 412 which are arranged in one direction, such as a row or column direction, can form a first touch electrode line, and the second touch electrodes 420 and the second connectors 422 can form a second touch electrode line.

Referring to FIG. 1 again, the connected first touch electrodes 410 of each row are connected to a touch driver (not illustrated) through first connecting wires 411, and the connected second touch electrodes 420 of each column are connected to the touch driver through second connecting wires 421. The first connecting wires 411 and the second connecting wires 421 can be formed in an outer region, i.e., a peripheral area DA of the touch area TA, or can be formed in the touch area TA.

Each of the end portions of the first connecting wires 411 and the second connecting wire 421 includes a pad 50, of which a portion has an enlarged area to be connected to an external driving circuit. The pads 50 can be formed in the peripheral area DA to form a pad unit 450.

The first connecting wires 411 can be used to input sensing input signals into the first touch electrodes 410 and to output sensing output signals to the touch driver through the pad unit 450. The second connecting wires 421 can be used to input sensing input signals into the second touch electrodes 420 and to output sensing output signals to the touch driver through the pad unit 450.

The first touch electrodes 410 and the second touch electrodes 420 that are adjacent to each other can form a mutual sensing capacitor serving as a touch sensor. The mutual sensing capacitor can receive a sensing input signal through one of the first and second touch electrodes 410 and 420 and can output a sensing output signal indicating a variation of the amount of charge stored therein caused by the contact of an external object to the other touch electrode.

Referring to FIG. 2 and FIG. 3 again, at least one of the first touch electrode line including the first touch electrodes 410, the second touch electrode line including the first touch electrodes 420 and the second connectors 422, and the connecting wires 411 and 421 can include a photosensitive conductive layer including a metal nanowire.

The photosensitive conductive layer can include a first photosensitive conductive layer and a second photosensitive conductive layer having different transmittances.

Each of the first photosensitive conductive layer and the second photosensitive conductive layer includes a photosensitive resin layer and a conductive layer formed of metal nanowires buried at an upper portion of the photosensitive resin layer. The metal nanowires are connected to each other to form a mesh and to serve as a conductive layer. In some embodiments, metal nanowires can be formed of copper and/or silver.

The first photosensitive conductive layer and the second photosensitive conductive layer can have a thickness of approximately 5 µm, and the conductive layer can have a thickness of 0.1 µm or less.

In some embodiments, the photosensitivities of the first photosensitive conductive layer and the second photosensitive conductive layer have opposite signs. For example, when the first photosensitive conductive layer has a positive photosensitivity, the second photosensitive conductive layer has a negative photosensitivity. Whereas, when the first photosensitive conductive layer has a negative photosensitivity, the second photosensitive conductive layer has a positive photosensitivity.

The first photosensitive conductive layer and the second photosensitive conductive layer have different transmittances and resistances. The first photosensitive conductive layer can have a transmittance and a resistance that are greater than those of the second photosensitive conductive layer.

In FIG. 2 and FIG. 3, the first touch electrodes 410, the second touch electrodes 420 including the second connector 422, and pad 50 are formed of a first photosensitive conductive layer and the connecting wires 411 and 421 are respectively formed as double layers including first photosensitive conductive layers 41 and 42 and second photosensitive conductive layers 43 and 44.

The touch electrode formed in the touch area TA desirably has a relatively high transmittance compared to the connecting wire formed in the peripheral area DA, and the connecting wire desirably has a relatively low resistance compared to the touch electrode.

According to at least one exemplary embodiment of the present disclosure, the metal nanowire of the photosensitive conductive layer has a contact area and a wiring area that increase as the density increases. However, the transmittance decreases in proportion to the increase in density. Similarly, as the density of the metal nanowire decreases, the transmittance increases, but the resistance also increases due to the low density of the metal nanowire.

Accordingly, the touch electrode formed in the touch area is formed of the first photosensitive conductive layer having a relatively high transmittance in spite of having a relatively high resistance, and the connecting wire formed in the non-touch area is formed of the second photosensitive conductive layer having a relatively low resistance in spite of having a relatively low transmittance. Additionally, as in the present exemplary embodiment, the connecting wire can further include the first photosensitive conductive layer.

Hereinafter, a method of manufacturing the aforementioned touch sensor will be described with reference to FIG. 4 to FIG. 11.

Figure 4:
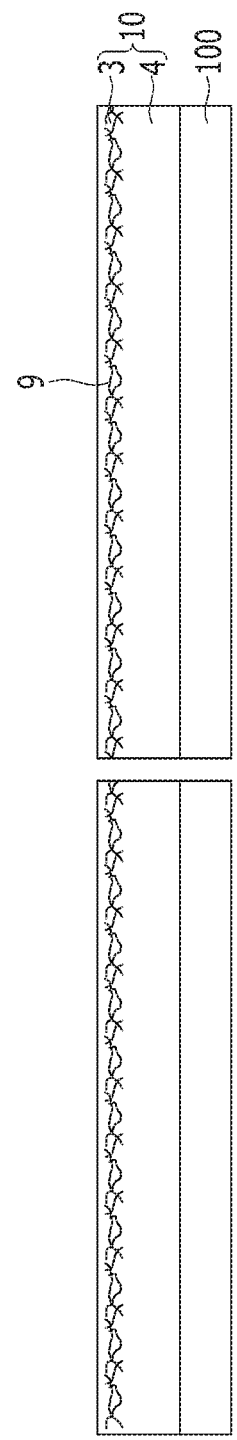
FIG. 4 is a cross-sectional view illustrating an intermediate step of a process in accordance with a method of manufacturing a touch panel according to an exemplary embodiment.
Figure 5:
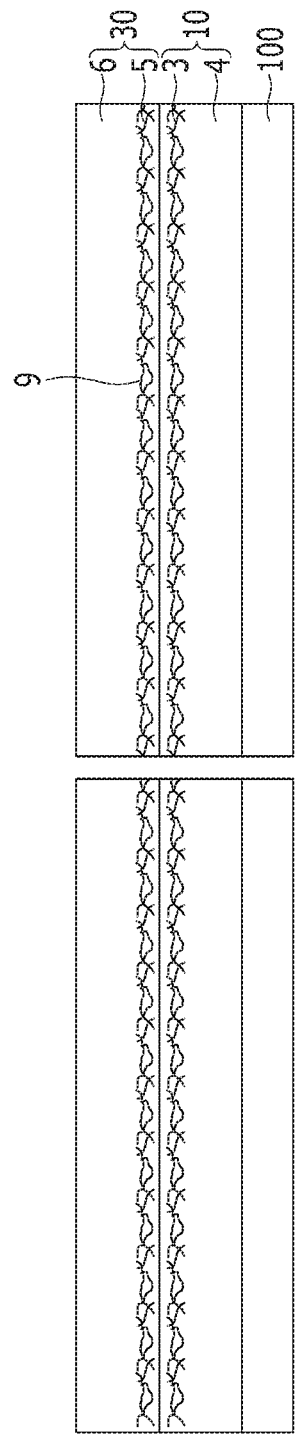
FIG. 5 is a cross-sectional view of a subsequent step to FIG. 4.
Figure 6:
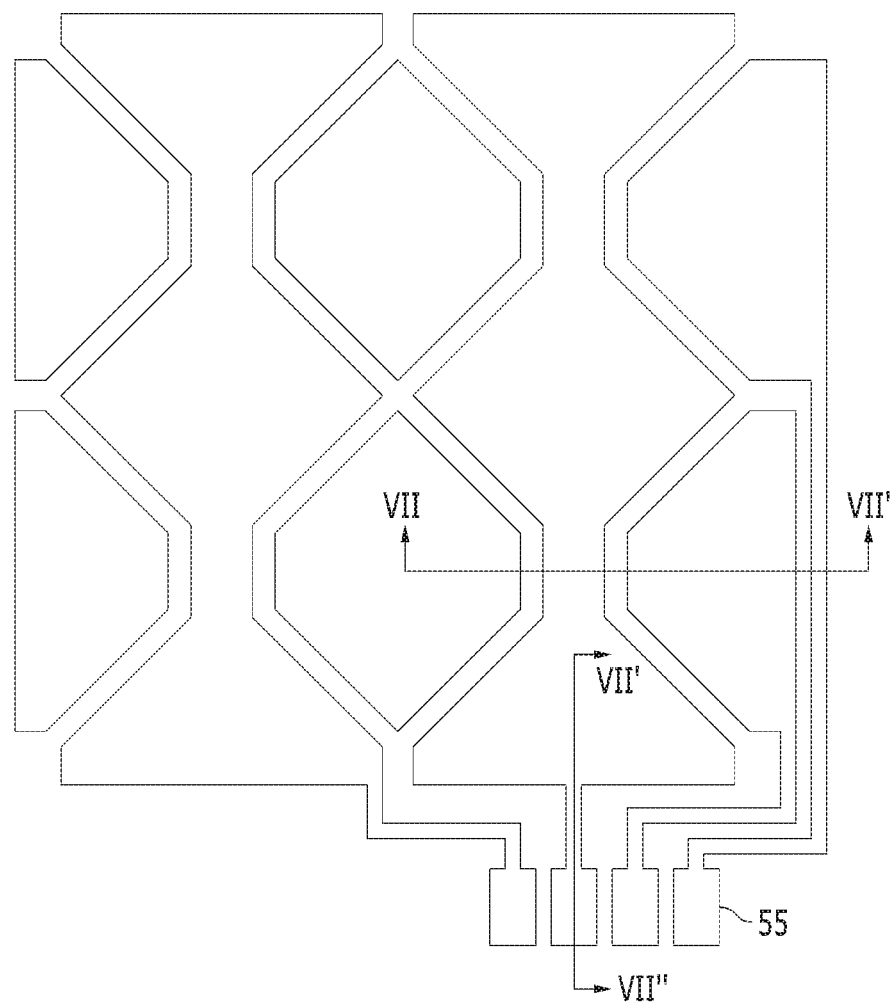
FIG. 6 is a layout view of a subsequent step to FIG. 5.
Figure 7:
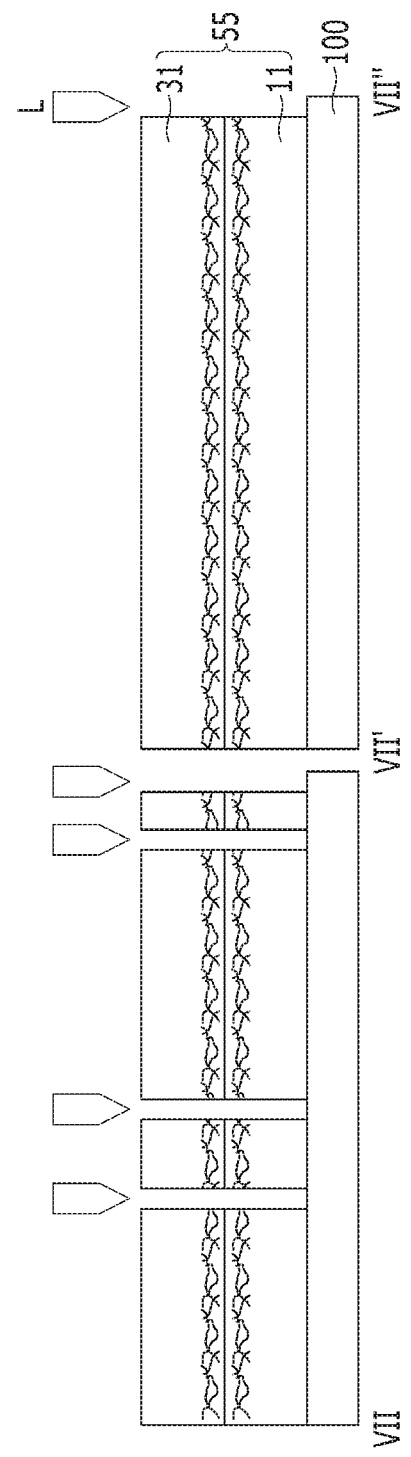
FIG. 7 consists of cross-sectional views take along line VII-VII' and line VII'-VII" of FIG. 6.
Figure 8:
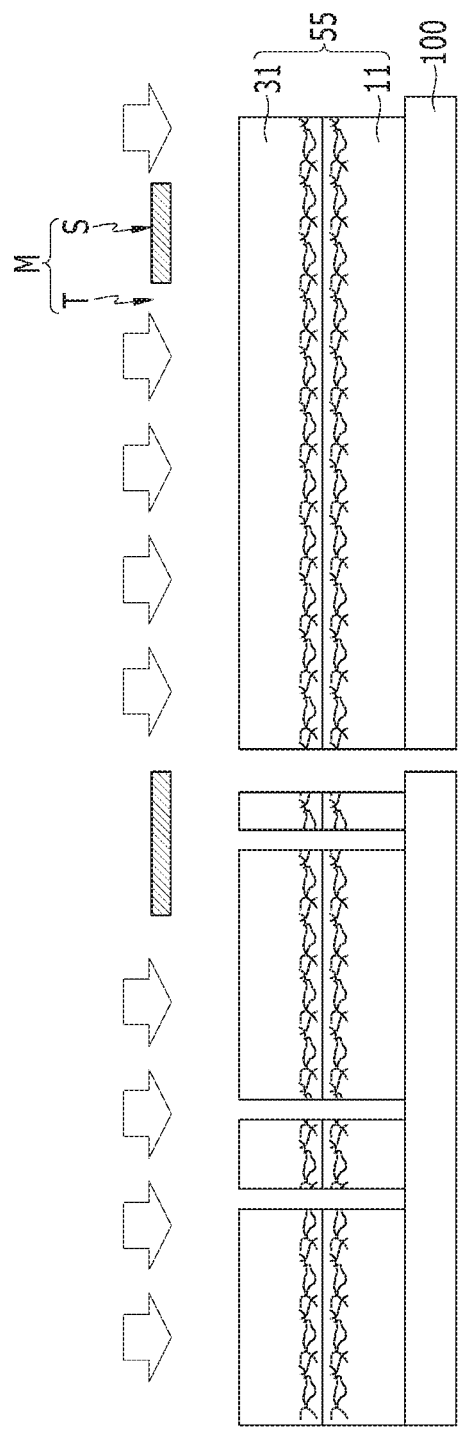
FIG. 8 is a cross-sectional view of a subsequent step to FIG. 7.
Figure 9:
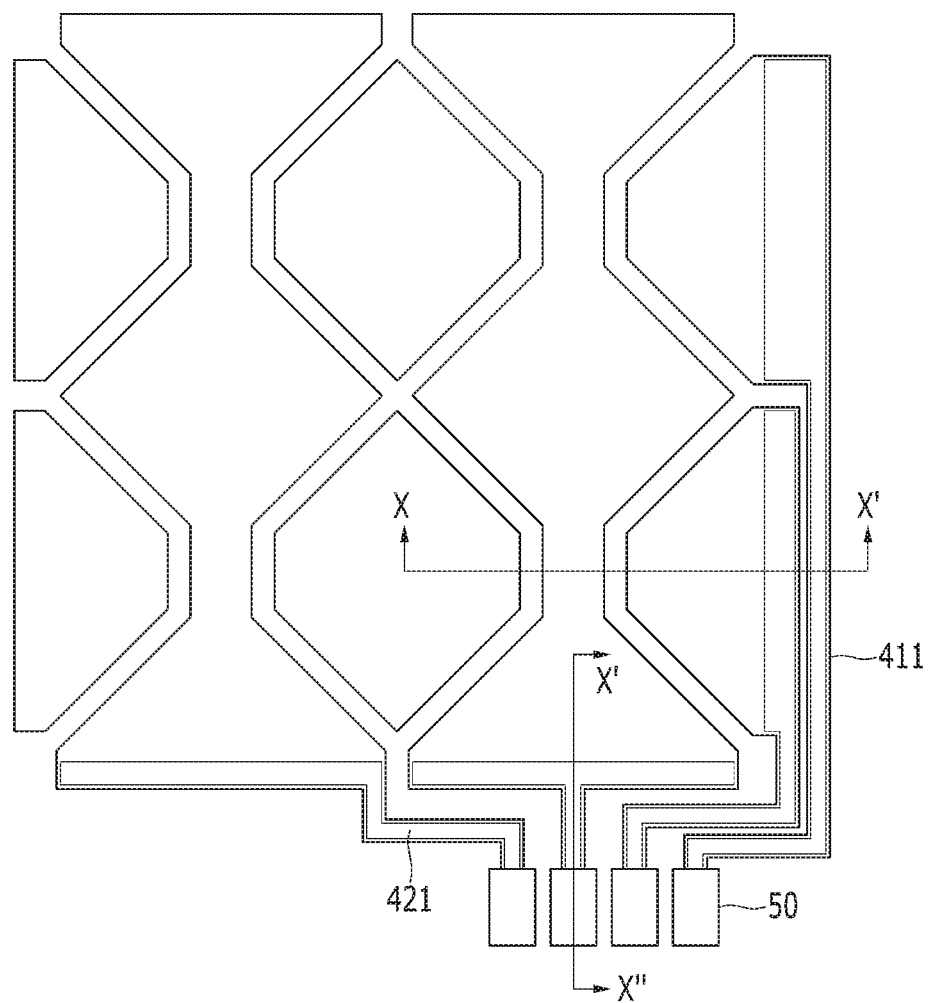
FIG. 9 is a layout view of a subsequent step to FIG. 8.
Figure 10:
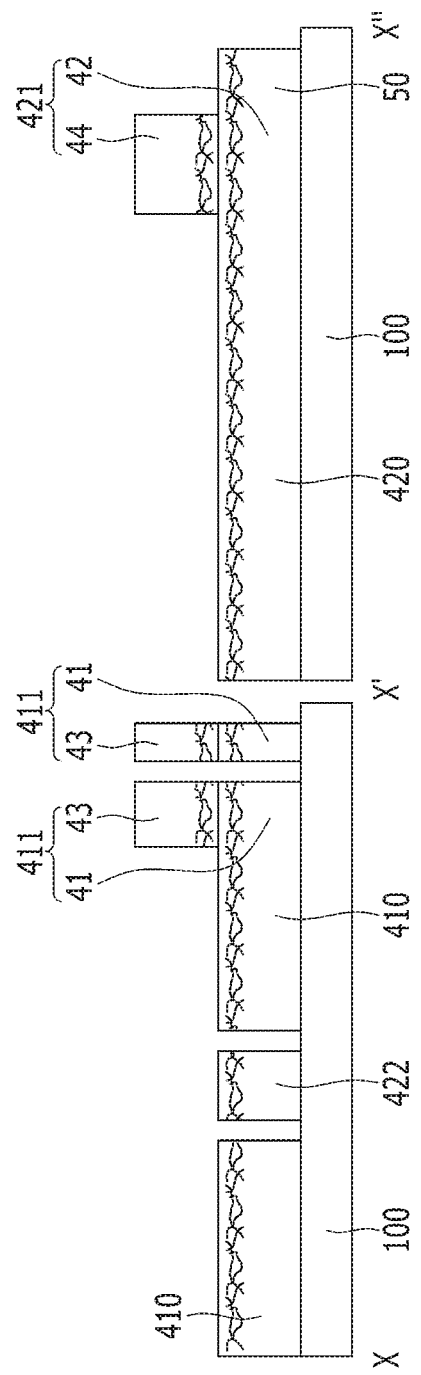
FIG. 10 consists of cross-sectional views take along line X-X' and line X'-X" of FIG. 9.
Figure 11:
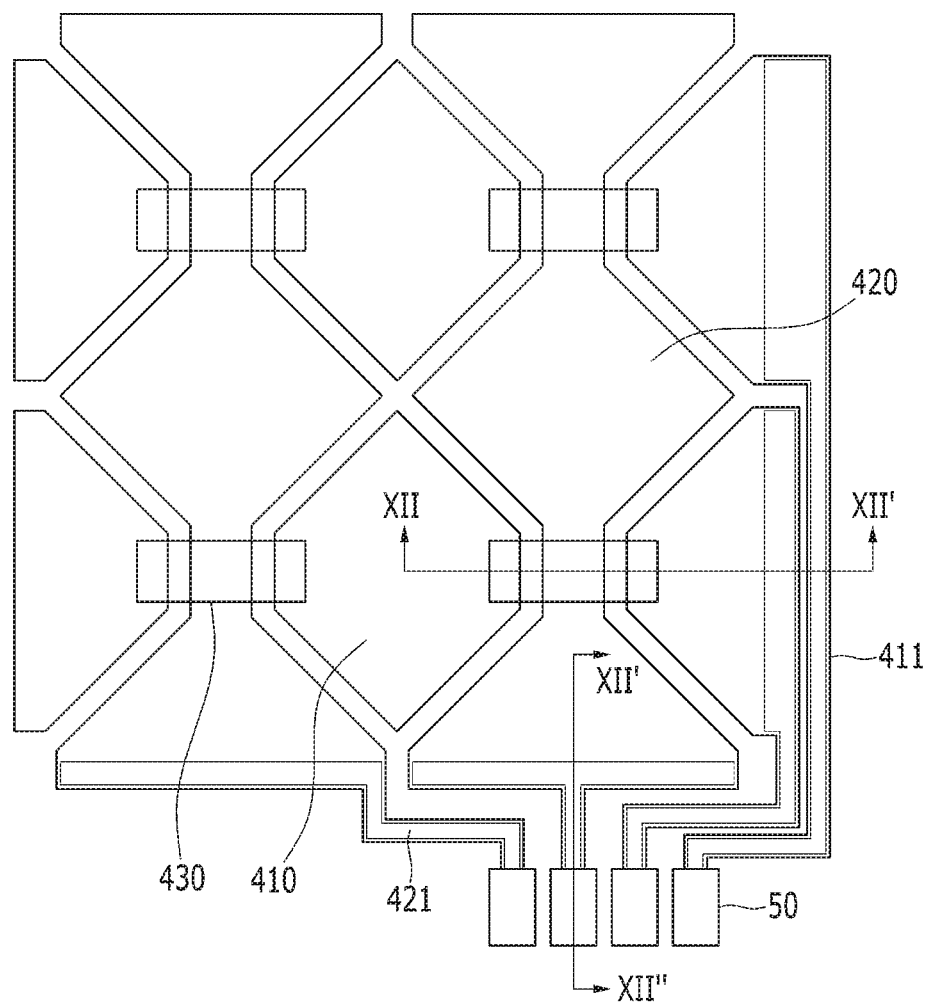
FIG. 11 is a layout view of a subsequent step to FIG. 9.
Figure 12:
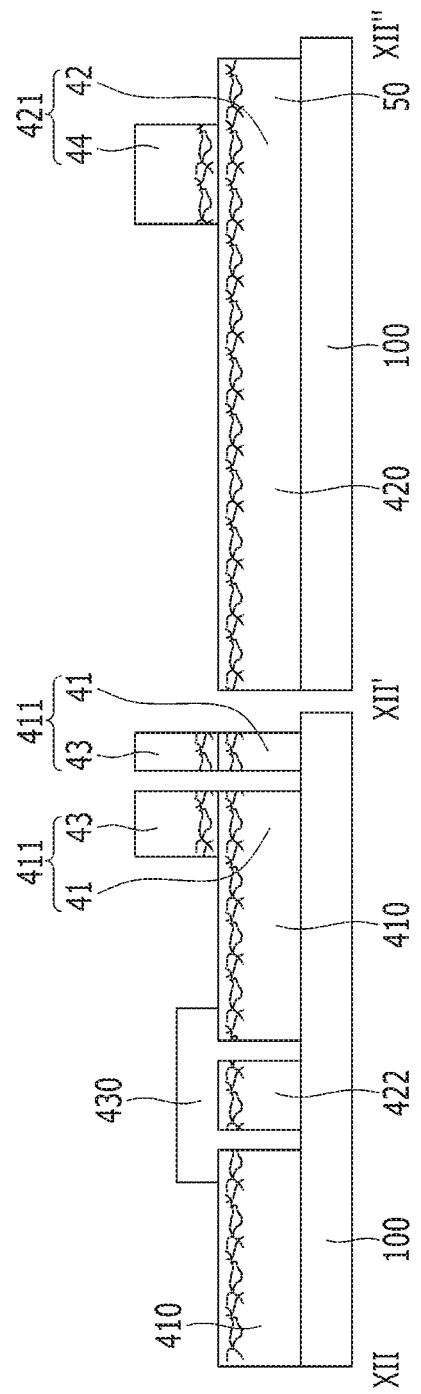
FIG. 12 is cross-sectional views take along line XII-XII' and line XII'-XII" of FIG. 9.

FIG. 4 is a cross-sectional view illustrating an intermediate step of a process in accordance with a method of manufacturing a touch panel according to an exemplary embodiment of the present disclosure. FIG. 5 is a cross-sectional view of a subsequent step to FIG. 4. FIG. 6 is a layout view of a subsequent step to FIG. 5. FIG. 7 consists of cross-sectional views take along line VII-VII' and line VII'-VII" of FIG. 6. FIG. 8 is a cross-sectional view of a subsequent step to FIG. 7. FIG. 9 is a layout view of a subsequent step to FIG. 8. FIG. 10 consists of cross-sectional views take along line X-X' and line X'-X" of FIG. 9. FIG. 11 is a layout view of a subsequent step to FIG. 9. FIG. 12 consists of cross-sectional views take along line XII-XII' and line XII'-XII" of FIG. 9.

First, as shown in FIG. 4, a substrate 100 is prepared, and a first photosensitive conductive layer 10 is transferred onto the substrate 100. For surface protection, a release paper (not illustrated) can be attached to the first photosensitive conductive layer 10. In these embodiments, the release paper can be removed before the photosensitive conductive layer 10 is transferred onto the substrate 100.

The first photosensitive conductive layer 10 includes a photosensitive resin layer 4 and a first conductive layer 3 including a silver nanowire 9. The photosensitive resin layer 4 of the first photosensitive conductive layer 10 can have a negative photosensitivity which allows exposed portions of the first photosensitive conductive layer 10 to remain.

The first conductive layer 3, which is buried in the photosensitive resin layer 4, can be formed at an upper portion of the first photosensitive conductive layer 10.

Next, as shown in FIG. 5, a second photosensitive conductive layer 30 is transferred onto the first photosensitive conductive layer 10. The second photosensitive conductive layer 30 can have an interlayer structure that is the same as that of the first photosensitive conductive layer 10. In other words, the second photosensitive conductive layer 30 includes a photosensitive resin layer 6 and a second conductive layer 5 including a silver nanowire 9. The photosensitive resin layer 6 of the second photosensitive conductive layer 30 can have a positive photosensitivity which allows exposed portions of the second photosensitive conductive layer 30 to be removed, which is the reverse of the photosensitive resin layer 4 of the first photosensitive conductive layer 10.

When the second photosensitive conductive layer 30 is transferred, the second conductive layer 5 is arranged to face the first conductive layer 3, such that the second conductive layer 5 contacts the first conductive layer 3 to be electrically connected thereto.

The second conductive layer 5 can have an electrical resistance and a light transmittance that are lower than that of the first conductive layer 3. The electrical resistance and light transmittance can be determined by adjusting the density of the silver nanowires 9, which is included in the first conductive layer 3 and the second conductive layer 5. Specifically, the electrical resistance can be reduced by including a greater amount of silver nanowires in the second conductive layer 5 than in the first conductive layer 3 to form more networks.

When the density of the silver nanowires 9 is increased to reduce the electrical resistance of the second conductive layer 5, the electrical resistance of the second conductive layer 5 is reduced compared to the first conductive layer 3, and the light transmittance is also decreased.

Next, as shown in FIG. 6 and FIG. 7, the second photosensitive conductive layer 30 and the first photosensitive conductive layer 10 are patterned by using a laser L to form a preliminary conductive pattern 55 including a lower layer 11 and an upper layer 31.

Next, as shown in FIG. 8, the upper layer 31 of the preliminary conductive pattern is exposed by using a photomask M. The photomask M includes a transmitting part T formed to correspond to the pad 50 (see FIG. 1) and a region at which the touch electrode is to be formed, as well as a light blocker S formed to correspond to a region (see FIG. 1) corresponding to a wire.

Next, as shown in FIG. 9 and FIG. 10, after the photomask M is removed, the preliminary conductive pattern is developed to form the second touch electrode 420 including the second connector 422, the first touch electrode 410, the pad 50, and the connecting wires 411 and 421. The development can be performed by using an alkali-based solution such as tetramethylammonium hydroxide (TMAH), sodium carbonate ($Na_2CO_3$), or potassium hydroxide (KOH).

An upper layer and a lower layer of the preliminary conductive pattern have opposite photosensitivities, and thus, the upper layer is removed during the development. Specifically, the upper layer has a positive photosensitivity, and thus, the portions that are not covered (i.e., exposed) by the photomask M as illustrated in FIG. 8 are removed during the development. However, the lower layer has a negative photosensitivity, and thus, the exposed portions remain. Accordingly, the upper layer is removed during the development.

The touch area in which the first and second touch electrodes 410 and 420 are formed can be attached to a display device so as to correspond to the display area of the display device. Accordingly, since the light transmittance of the touch area has a predetermined level or greater, the upper layer having relatively low light transmittance is removed and the lower layer remains to increase the light transmittance of the touch area.

The pad 50 serves to receive external signal(s) and is electrically insulated by a photosensitive resin of the upper layer when the upper layer remains. Accordingly, the conductive layer of the lower layer can be exposed by removing the upper layer formed in the pad 50.

Further, the connecting wires 411 and 421 are mainly formed in the peripheral area DA outside of the touch area and include the upper layer having low resistance to minimize signal delay and the like caused by increased resistance. That is, the connecting wires 411 and 421 are formed as double layers including the first photosensitive conductive layers 41 and 42 and the second photosensitive conductive layers 43 and 44.

As such, as in at least one exemplary embodiment of the present disclosure, it is possible to simultaneously and easily form a touch sensor and wires connected thereto by using photosensitive conductive layers having opposite photosensitivities.

Next, as shown in FIG. 11 and FIG. 12, an insulating film is formed on the substrate 100, and then patterned to form the insulating layer 430.

The insulating layer 430 can be formed of an organic material having a low dielectric constant or an inorganic material such as a silicon oxide or a silicon nitride in a single layer or in a plurality of layers.

Next, as shown in FIG. 2 and FIG. 3, the first connector 412 is formed on the insulating layer 430. The first connector 412 electrically connects adjacent first touch electrodes 410 and can be formed of a low resistance metal, e.g., copper or aluminum.

Figure 13:
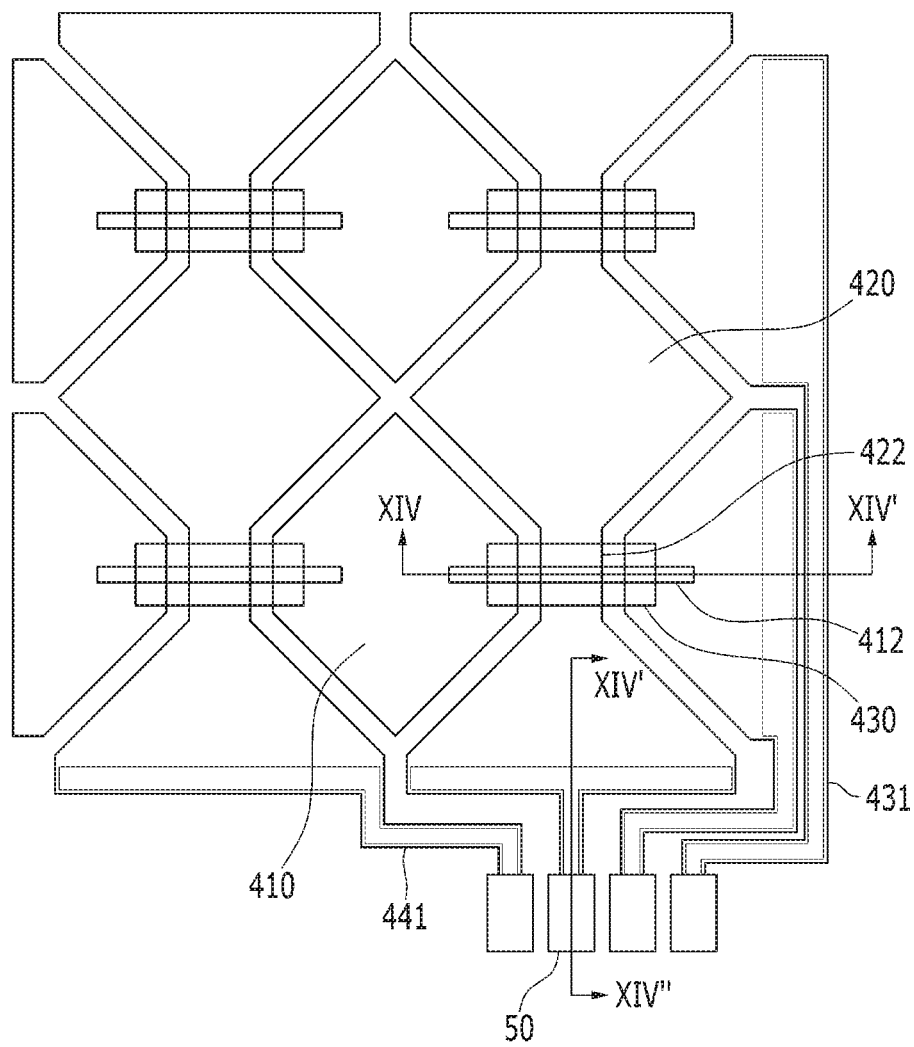
FIG. 13 is a layout view of a touch panel according to an exemplary embodiment.
Figure 14:
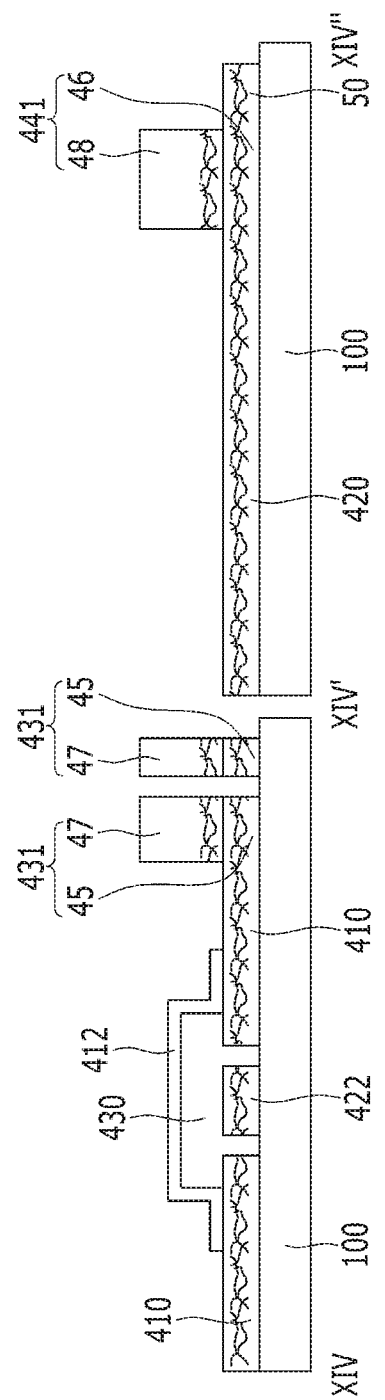
FIG. 14 consists of cross-sectional views take along line XIV-XIV' and line XIV'-XIV" of FIG. 13.

FIG. 13 is a layout view of a touch panel according to an exemplary embodiment. FIG. 14 consists of cross-sectional views taken along line XIV-XIV' and line XIV'-XIV" of FIG. 13.

The touch panel illustrated in FIG. 13 and FIG. 14 is similar to the touch sensor illustrated in FIG. 1 to FIG. 3, and thus only those portions that are different will be described in detail.

As shown in FIG. 13 and FIG. 14, the touch panel according to the present exemplary embodiment includes a touch substrate 100, a plurality of first touch electrode lines formed in a touch area TA and including a plurality of first touch electrodes 410 which are connected by a plurality of first connectors 412, and a plurality of second touch electrode lines including a plurality of second touch electrode 420 which are connected by a plurality of second connectors 422. Each of the touch electrode lines is connected to connecting wires 431 and 441 formed in a peripheral area DA, and pads 50 are connected to one end of each of the connecting wires 431 and 441.

The first connectors 412 are formed on an insulating layer 430 and are electrically insulated from the second connectors 422 with the insulating layer 430 interposed therebetween. The second connectors 422 and the second touch electrodes 420 can be integrally formed.

The first touch electrodes 410, the second connectors 422, the second touch electrodes 420, which are formed within the touch area TA and the pads 50 formed in the peripheral area DA, can be formed of metal nanowires. The metal nanowires are connected to each other in a mesh to serve as a conductive electrode.

The first touch electrodes 410, the second connectors 422, and the second touch electrodes 420, and the pads 50 formed in the peripheral area DA can further include an overcoat formed of a polymer resin. The overcoat can be mixed with the metal nanowires to be coated together therewith, or can be coated on the coated metal nanowires.

The overcoat can include an acrylate-based organic material such as an acryl polyester resin. The overcoat can be coated on metal nanowires after the metal nanowires are formed. The overcoat can fill the space between the metal nanowires to increase adherence between the metal nanowires and the substrate 100.

The connecting wires 431 and 441 formed in the peripheral area can be formed as double layers including lower connecting wires 45 and 46 and upper connecting wires 47 and 48 containing the metal nanowires.

The lower connecting wires 45 and 46 can be formed of the same material as that of the first touch electrodes 410, the second connectors 422, and the second touch electrodes 420, and the pads 50 formed in the peripheral area DA, and can be formed together therewith.

The upper connecting wires 47 and 48 include photosensitive layers formed of photosensitive materials and conductive layers formed below the photosensitive layers to include metal nanowires. The metal nanowires of the conductive layers are buried in the photosensitive layers, and the conductive layers are electrically connected to the lower connecting wires 47 and 48.

Hereinafter, a method of manufacturing a touch panel according to an exemplary embodiment of the present disclosure will be described with reference to FIG. 15 to FIG. 21.

Figure 15:
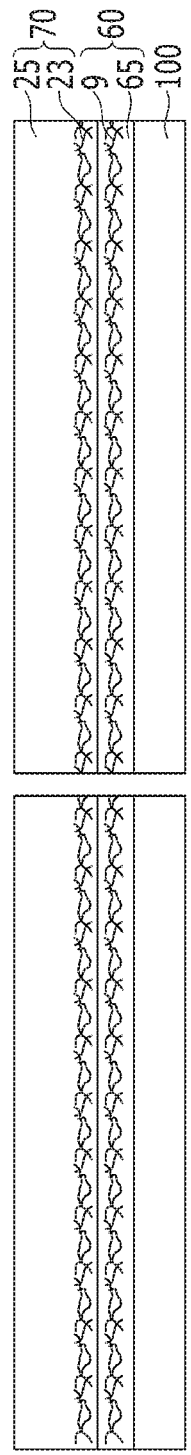
FIG. 15 is a cross-sectional view illustrating an intermediate step of a process in accordance with a method of manufacturing a touch panel according to an exemplary embodiment.
Figure 16:
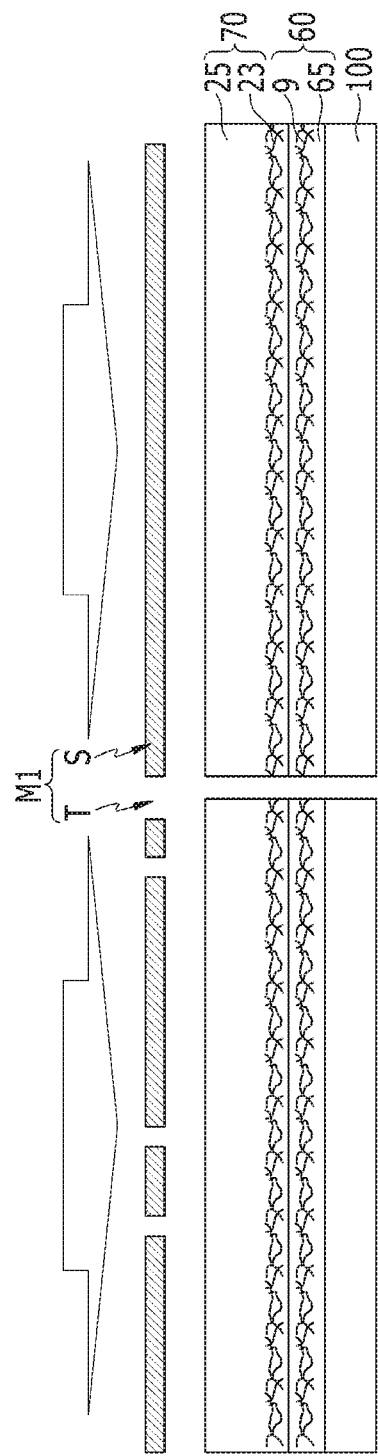
FIG. 16 is a cross-sectional view of a subsequent step to FIG. 15.
Figure 17:
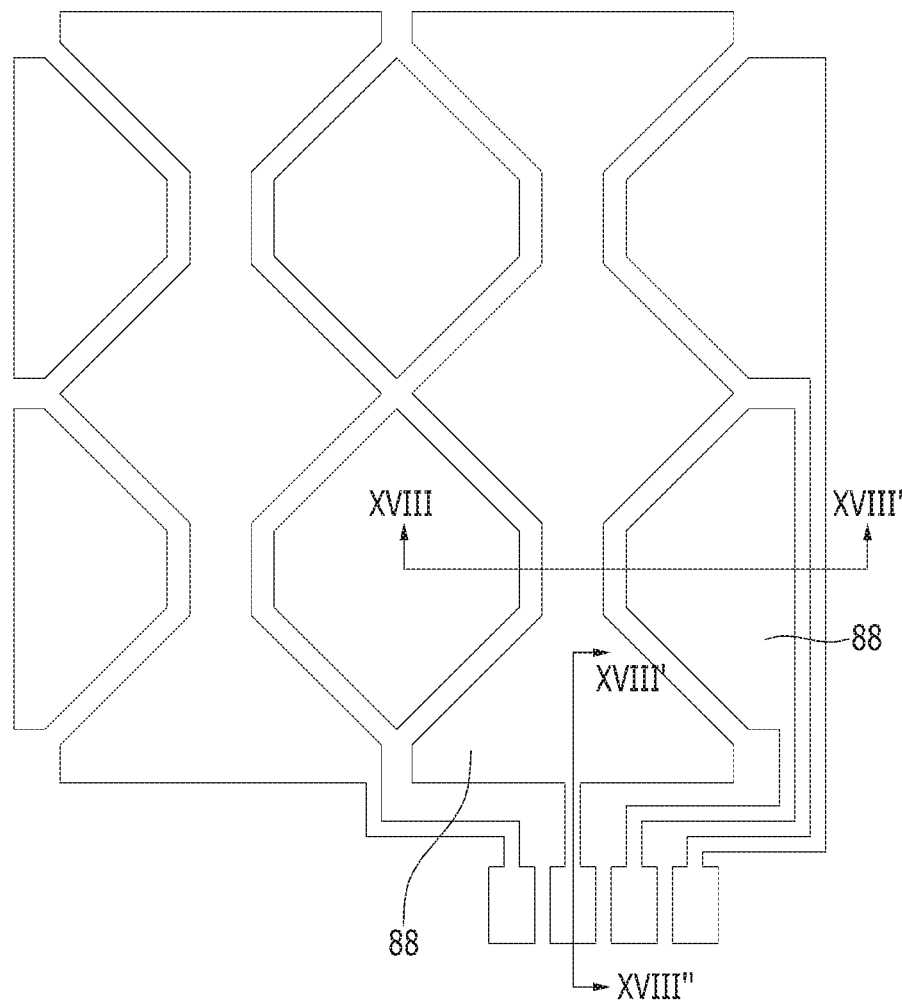
FIG. 17 is a layout view of a subsequent step to FIG. 16.
Figure 18:
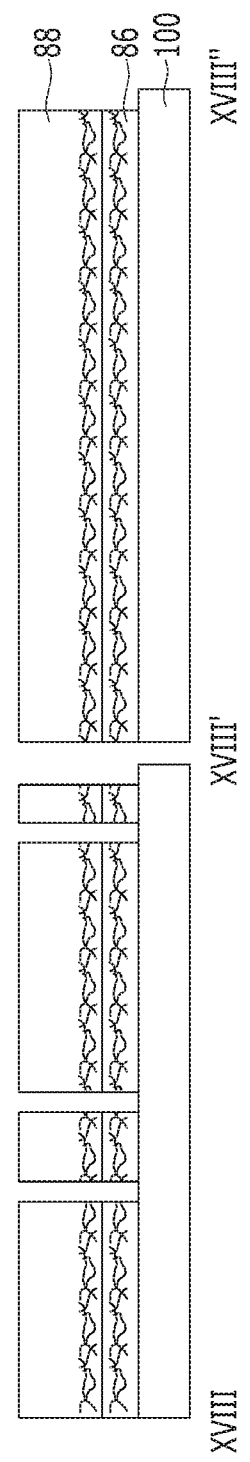
FIG. 18 consists of cross-sectional views take along line XVIII-XVIII' and line XVIII'-XIII" of FIG. 17.
Figure 19:
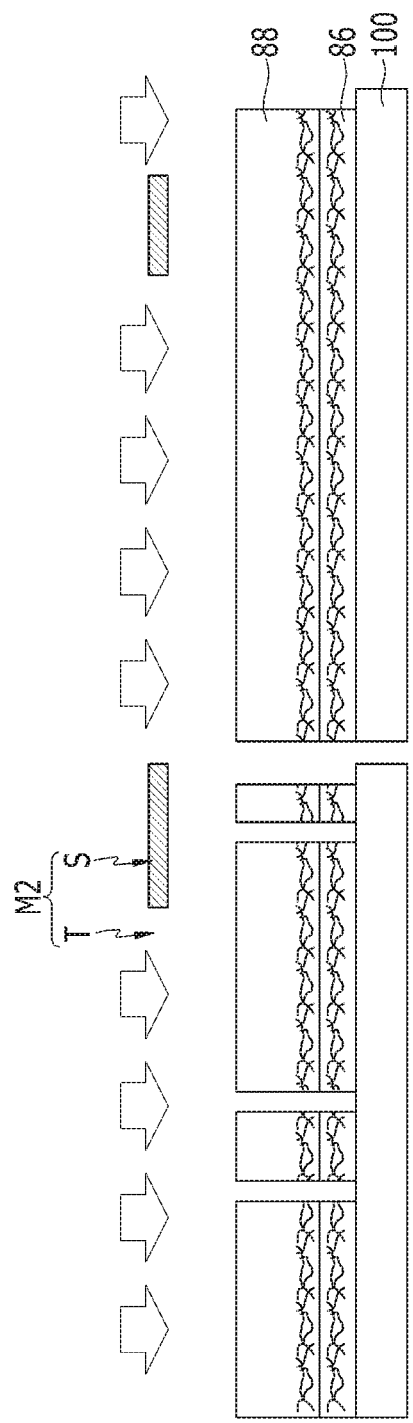
FIG. 19 is a cross-sectional view of a subsequent step to FIG. 18.
Figure 20:
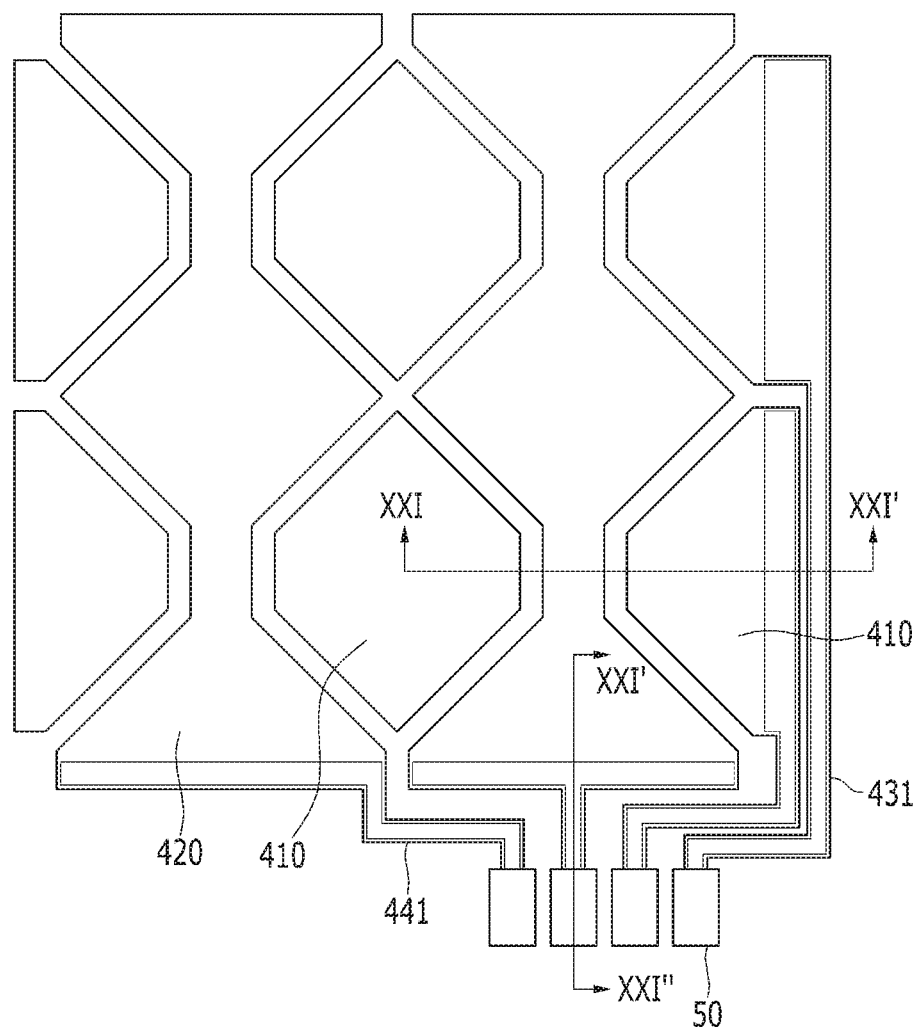
FIG. 20 is a layout view of a subsequent step to FIG. 19.
Figure 21:
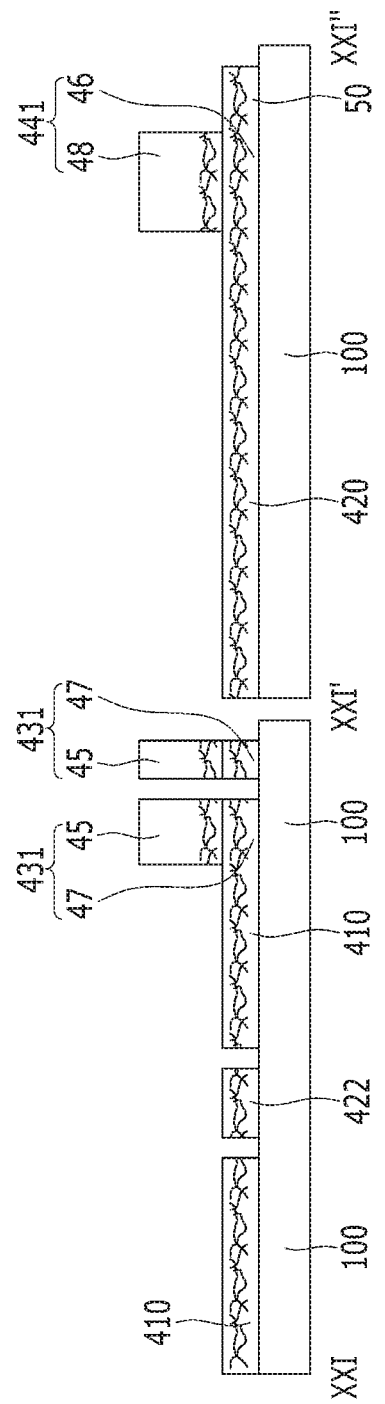
FIG. 21 consists of cross-sectional views take along line XXI-XXI' and line XXI'-XXI" of FIG. 20.

FIG. 15 is a cross-sectional view illustrating an intermediate step of a process in accordance with a method of manufacturing a touch panel according to an exemplary embodiment of the prevent disclosure. FIG. 16 is a cross-sectional view of a subsequent step to FIG. 15. FIG. 17 is a layout view of a subsequent step to FIG. 16. FIG. 18 consists of cross-sectional views take along line XVIII-XVIII' and line XVIII'-XIII" of FIG. 17. FIG. 19 is a cross-sectional view of a subsequent step to FIG. 18. FIG. 20 is a layout view of a subsequent step to FIG. 19. FIG. 21 is cross-sectional views take along line XXI-XXI' and line XXI'-XXI" of FIG. 17.

First, as shown in FIG. 15, a substrate 100 is prepared, and a conductive layer 60 is formed by coating metal nanowires, e.g., silver nanowires 9 on the substrate 100. The silver nanowires 9 can be coated together with the overcoat 65 by using a solution process, e.g., spin coating, inkjet method or screen printing.

Further, after the silver nanowires 9 are coated, the overcoat 65 can be additionally coated to form a conductive layer 60.

Next, a photosensitive conductive layer 70 is transferred on the conductive layer 60. The photosensitive conductive layer 70 can be the same photosensitive conductive layer as the second photosensitive conductive layer illustrated in FIG. 5. Specifically, the photosensitive conductive layer 70 includes a photosensitive resin layer 25, and a conductive layer 23 included in the photosensitive resin layer 25. In some embodiments, silver nanowires are buried in the conductive layer 23.

Next, as shown in FIG. 16, a first exposure is performed on the photosensitive conductive layer 70 by using a first photomask M1.

The first photomask M1 includes a light blocker S formed to correspond to a region at which the touch electrode is to be formed and a transmitting part T formed to correspond to a gap that is to be formed between touch electrodes.

FIG. 16 illustrates an embodiment where the photosensitive conductive layer has a positive photosensitivity. In contrast, when the photosensitive conductive layer has a negative photosensitivity, the first photomask can include a transmitting part formed to correspond to a region at which the touch electrode is to be formed and a light blocker formed to correspond to a gap that is to be formed between touch electrodes.

Next, as shown in FIG. 17 and FIG. 18, a first preliminary conductive pattern 88 is formed by developing the photosensitive conductive layer. Then, the conductive layer that is exposed to a lower portion is etched by using the first preliminary conductive pattern 88 as a mask to form a second preliminary conductive pattern 86.

Next, as shown in FIG. 19, a second exposure is performed on the first preliminary conductive pattern 88 by using a second photomask M2.

The second photomask M2 includes a transmitting part T formed to correspond to a region at which the electrode is to be formed, along with the pad (see FIG. 1) and a light blocker S formed to correspond to a region (see FIG. 1) corresponding to a wire.

Next, as shown in FIG. 20 and FIG. 21, the second touch electrodes 420 including the first touch electrodes 410 and the second connector 422, the pad 50, and the connecting wires 431 and 441 are formed by developing the first preliminary conductive pattern.

The connecting wires 431 and 441 formed at the non-touch area are respectively formed as double layers including lower connecting wires 45 and 46 formed of conductive films and upper connecting wires 47 and 48 formed of photosensitive conductive layers.

The first preliminary conductive pattern has photosensitivity, while the second preliminary conductive pattern has no photosensitivity. Accordingly, the first preliminary conductive pattern can be easily removed by performing exposure and development.

As such, as in at least one exemplary embodiment of the present disclosure, it is possible to easily manufacture a touch sensor by selecting positive or negative photosensitivity regardless of a photosensitive characteristic of the lower conductive film.

Next, as shown in FIG. 13 and FIG. 14, an insulating film is formed on the substrate 100, and is patterned to form an insulating layer 430.

The insulating layer 430 can be formed of an organic material having a low dielectric constant, or an inorganic material such as a silicon oxide or a silicon nitride in a single layer or in a plurality of layers.

The first connector 412 is formed on the insulating layer 430. The first connector 412 connects adjacent first touch electrodes 410 and can be formed of a low resistance metal, e.g., copper or aluminum.

While this disclosure has been described in connection with what is presently considered to be practical exemplary embodiments, it is to be understood that the disclosure is not limited to the disclosed embodiments but, on the contrary, is intended to cover various modifications and equivalent arrangements included within the spirit and scope of the appended claims.

What is claimed is:

1. A method of manufacturing a touch panel, comprising:
   forming a first photosensitive conductive layer, which comprises a first photosensitive resin layer and a first metal nanowire layer buried at an upper portion of the first photosensitive resin layer, over a substrate;
   forming a second photosensitive conductive layer, which comprises a second photosensitive resin layer and a second metal nanowire layer buried at an lower portion of the second photosensitive resin layer, over the first photosensitive conductive layer, wherein photosensitivities of the first and second photosensitive conductive layers have opposite signs;
   forming a preliminary conductive pattern by patterning the second photosensitive conductive layer and the first photosensitive conductive layer such that the first photosensitive conductive layer and the second photosensitive conductive layer have a same pattern in a plan view, such that a first sidewall of the first photosensitive conductive layer is aligned with a second sidewall of the second photosensitive conductive layer; and
   forming i) a touch electrode in a touch area of the substrate and ii) a connecting wire outside of the touch area and electrically connected to the touch electrode by removing at least a portion of the second photosensitive conductive layer formed in the touch area through exposure and development of the preliminary conductive pattern.

2. The method of claim 1, wherein the forming of the second photosensitive conductive layer is performed such that a first conductive layer of the second photosensitive conductive layer contacts a second conductive layer of the first photosensitive conductive layer.

3. The method of claim 1, wherein the forming of the first photosensitive conductive layer is performed by removing a release paper from the first photosensitive conductive layer and then transferring the first photosensitive conductive layer onto the substrate, and wherein the forming of the second photosensitive conductive layer is performed by removing a release paper from the second photosensitive conductive layer and then transferring the second photosensitive conductive layer onto the first photosensitive conductive layer.

4. A method of manufacturing a touch panel, comprising:
   forming a first photosensitive conductive layer comprising a first photosensitive resin layer and a first metal nanowire buried in the first photosensitive resin layer over a substrate;
   forming a second photosensitive conductive layer comprising a second photosensitive resin layer and a second metal nanowire buried in the second photosensitive resin layer over the first photosensitive conductive layer, wherein a first conductive layer of the second photosensitive conductive layer contacts a second conductive layer of the first photosensitive conductive layer, and wherein photosensitivities of the first and second photosensitive conductive layers have opposite signs;
   forming a preliminary conductive pattern by patterning the second photosensitive conductive layer and the first photosensitive conductive layer; and
   forming i) a touch electrode in a touch area of the substrate and ii) a connecting wire outside of the touch area and electrically connected to the touch electrode by removing at least a portion of the second photosensitive conductive layer formed in the touch area through exposure and development of the preliminary conductive pattern,
   wherein the first conductive layer of the first photosensitive conductive layer has a greater density of metal nanowires than the second conductive layer of the second photosensitive conductive layer.

5. A method of manufacturing a touch panel, the method comprising:
   forming a conductive film including a metal nanowire over a substrate;
   forming a photosensitive conductive layer, which comprises a photosensitive resin layer and a metal nanowire layer buried at an upper portion of the photosensitive resin layer, over the conductive film;
   forming an upper preliminary conductive pattern by performing a first exposure and development;
   forming a lower preliminary conductive pattern by etching the photosensitive conductive layer by using the upper preliminary conductive pattern as a mask such that the upper preliminary conductive pattern and the lower preliminary conductive pattern have a same pattern in a plan view, such that a first sidewall of the upper preliminary conductive pattern is aligned with a second sidewall of the lower preliminary conductive pattern; and
   forming i) a touch electrode in a touch area of the substrate and ii) a connecting wire outside of the touch area and electrically connected to the touch electrode by removing the upper preliminary conductive pattern formed in the touch area through a second exposure and development.

6. The method of claim 5, wherein the forming of the photosensitive conductive layer comprises removing a release paper attached on the photosensitive conductive layer and then transferring the photosensitive conductive layer such that the metal nanowire layer contacts the conductive film.

\* \* \* \* \*